United States Patent [19]

Rieman

[11] 4,205,889

[45] Jun. 3, 1980

[54] PRINTED CIRCUIT AND FASTENER ASSEMBLIES, AND METHODS OF ASSEMBLING PRINTED CIRCUITS WITH MOUNTING ELEMENTS

[75] Inventor: Richard F. Rieman, Marion City, Ind.

[73] Assignee: Western Electric Company, Inc., New York, N.Y.

[21] Appl. No.: 17,881

[22] Filed: Mar. 5, 1979

[51] Int. Cl.$^2$ .............................................. H05K 1/12

[52] U.S. Cl. .................................... 339/17 M; 29/832

[58] Field of Search ............ 339/17 C, 17 M, 17 LM, 339/17 N, 18 R, 18 B, 18 C, 18 P, 252 R, 252 P; 361/412, 413; 29/626

[56] References Cited

U.S. PATENT DOCUMENTS

| | | | |
|---|---|---|---|
| 2,910,672 | 10/1959 | Patka | 339/17 M |
| 3,365,619 | 1/1968 | Kitzmiller et al. | 361/420 |
| 3,492,627 | 1/1970 | Tauscher | 339/252 P |
| 3,568,001 | 3/1971 | Straus | 339/17 M |
| 3,756,115 | 9/1973 | Schuplin | 85/5 R |
| 3,803,670 | 4/1974 | Johnson | 24/73 P |

OTHER PUBLICATIONS

IBM Bulletin, Palmateer, vol. 5, No. 4, p. 26, 9-1962.
IBM Bulletin, Kryzaniwsky, vol. 14, No. 9, p. 2599, 2-1972.

*Primary Examiner*—Neil Abrams
*Attorney, Agent, or Firm*—J. L. Landis

[57] ABSTRACT

A snap fastener (10) is provided to assemble, both mechanically and electrically, a printed circuit (11) with a conductive mounting element (12), such as a conductive ring (16) having a bore (26), for providing electrical connection between a conductive portion or pad (13) of the circuit and the mounting element. The fastener is formed of a conductive material and has a first portion, such as a flat head (17), that is fixed to the pad (13) and a plurality of tapered, conductive spring fingers (25) that project outwardly from the circuit and are adapted to be inserted into the bore (26) of the mounting element, so that the fingers are first cammed inwardly by the walls of the bore, and then spring outwardly to make the connection. Preferably, the fingers are formed with indented midsections (29), between tapered inner and outer end sections (33, 27), for resiliently gripping the walls of the bore (26).

7 Claims, 4 Drawing Figures

PRINTED CIRCUIT AND FASTENER ASSEMBLIES, AND METHODS OF ASSEMBLING PRINTED CIRCUITS WITH MOUNTING ELEMENTS

TECHNICAL FIELD

This application relates generally to fastener devices and fastener-printed circuit assemblies for mechanically and electrically connecting portions of the printed circuit to a mounting element, and to methods of assembling such components.

BACKGROUND OF THE INVENTION

In the past, it has been customary to assemble printed circuit boards, such as flexible printed circuits used in telephone handsets, to conductive mounting elements by using conductive machine screws to mechanically connect the circuit to the mounting element, while electrically connecting a portion of the circuit to a conductive portion of the mounting element. Typically, such a connecting screw has a threaded section designed to be screwed into a tapped hole in a conductive insert or nut, fastened in the mounting element, and has a flat head section that is screwed down onto a conductive pad area of the circuit board to make an electrical connection between the pad and the insert, while also mechanically fastening the elements together.

SUMMARY OF THE INVENTION

General objects of this invention are to provide simple snap fasteners, fastener-printed circuit assemblies and methods of assembling printed circuits with mounting elements, that can be used to replace such screw-mounting assemblies. Some advantages of the invention relate to:

(a) ease and cost savings in manufacture, eliminating the need for special assembly tools, and for stocking loose screws;

(b) ease in disassembly, to repair circuit components beneath the printed circuit, and reassembly, without the need for tools and keeping track of loose screws; and (c) potential extended life for the circuits due to elimination of twisting torque on the circuit conductors during assembly and field reassembly.

A specific object of the invention is to provide a low cost snap fastener that can be pre-fixed to a printed circuit on manufacture of the circuit, that can be simply assembled with conductive mounting elements, without tools, and that can easily be disassembled from the mounting element by simply pulling up an edge of the printed circuit.

With the foregoing and other objects in view, a fastener-printed circuit assembly and method of assembly, in accordance with certain features of the invention, utilizes a snap fastener of conductive material having a first or head portion mechanically and electrically connected to a desired conductive portion or pad of the printed circuit. The fastener includes a plurality of tapered, conductive spring fingers projecting outwardly from the printed circuit, after assembly of the fastener and circuit. The fingers are inserted into a bore of a conductive mounting element or ring and are contoured so that, upon insertion, the fingers are initially cammed inwardly by the walls of the bore, following which the fingers spring outwardly to mechanically connect the fastener to the conductive element and to make the electrical contact therewith.

Preferably, the fingers are further shaped so that the fastener and printed circuit may readily be removed from the mounting element by lifting up on the printed circuit; that is, from the outer surface of the printed circuit, after assembly. The inner surface of the printed circuit, that facing the mounting element, is usually inaccessible.

Preferably, the fastener includes a flat head portion, which is fixed as by soldering to a conductive pad on the outer surface of the circuit board, the board having a through hole in the pad area through which the fingers extend. Preferably, each finger is formed with a first portion tapering outward from the head section, an indented midsection for resiliently gripping the walls of the bore in the mounting element, and an inwardly tapered end section adapted to be cammed inwardly when the end sections of the fingers are inserted into the bore.

Other objects, advantages and features of the invention will be apparent from the following detailed description of a specific embodiment thereof, when read in conjunction with the accompanying drawings.

DETAILED DESCRIPTION

Figure 1:
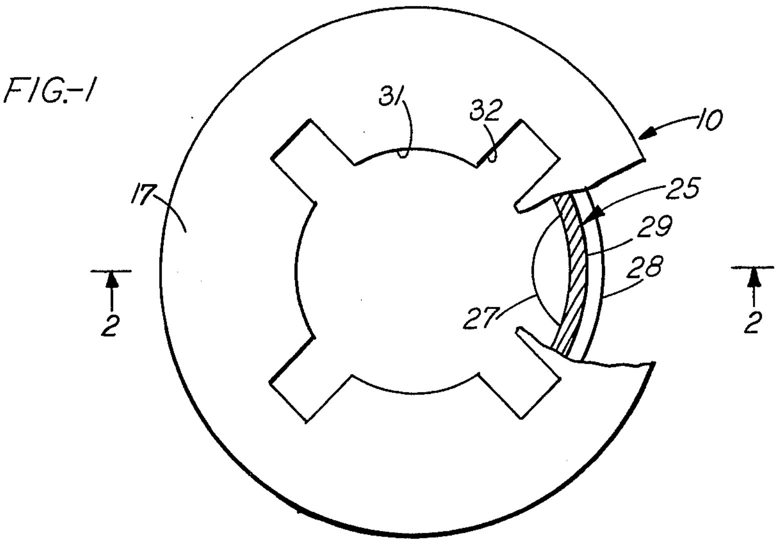
FIG. 1 is a top plan view of a fastener in accordance with a specific embodiment of the invention, portions being broken away in horizontal section along line 1—1 of FIG. 2.
Figure 2:
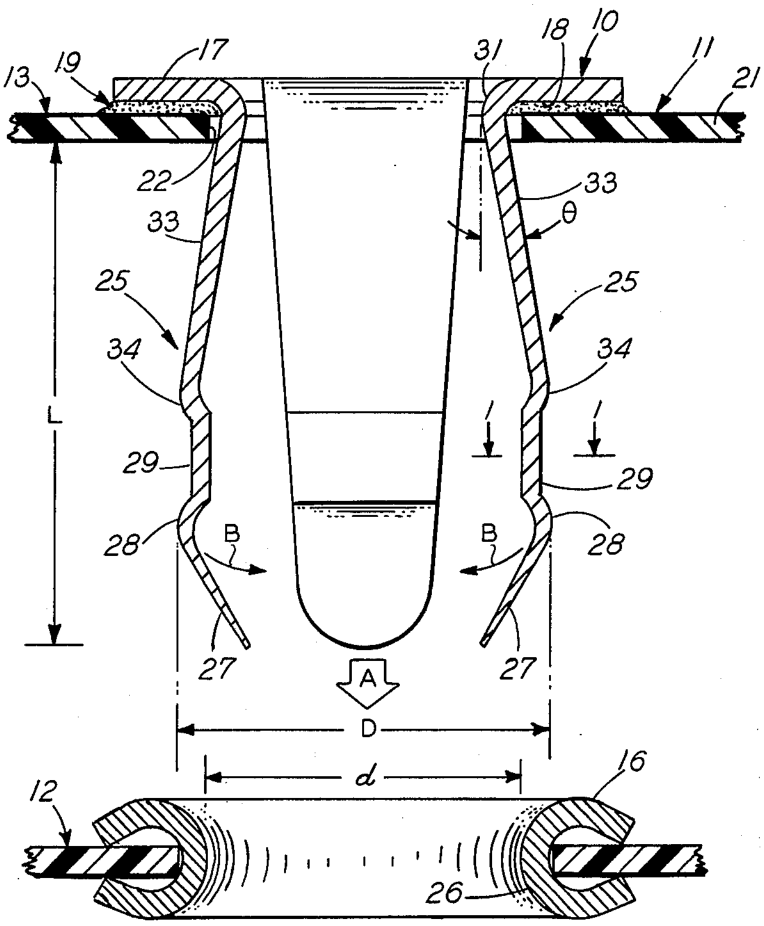
FIG. 2 is a vertical section along line 2—2 of FIG. 1, showing the fastener preassembled with a printed circuit prior to assembly with a mounting element.
Figure 3:
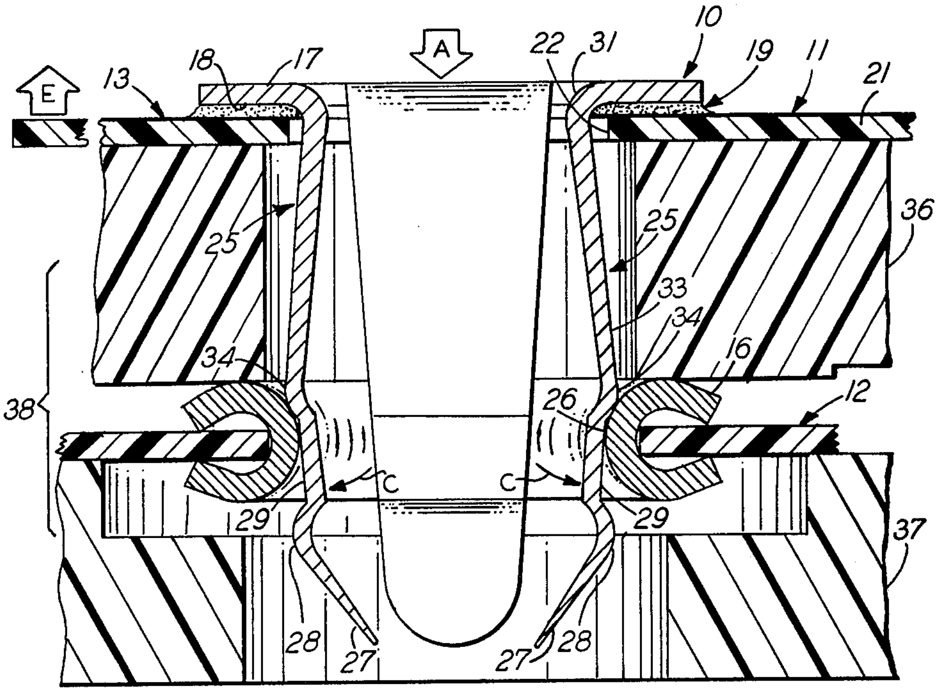
FIG. 3 is a vertical section similar to FIG. 2, illustrating a completed assembly of the fastener, printed circuit, and mounting element.

Referring now in detail to the drawings, FIGS. 1–2 illustrate a snap fastener 10 in accordance with certain features of the invention. As illustrated in FIGS. 2–3, the fastener 10 is used to mechanically secure a printed circuit 11 to a mounting element 12, while preferably electrically connecting a conductive area or pad 13 (FIG. 4) of the printed circuit 11 to a conductive portion 16 of the mounting element 12.

The fastener 10 is preferably fabricated from an electrically conductive spring metal, such as silverplated brass, so as to serve as an electrical, as well as physical, connecting or contact element for the printed circuit pad 13. In the specific example illustrated, the mounting element comprises a second printed circuit (12) and the conductive portion thereof comprises a conductive grommet or ring (16) mounted in a through hole of the second printed circuit 12 and connected to conductive areas or pads (not shown) deposited on that circuit.

Figure 4:
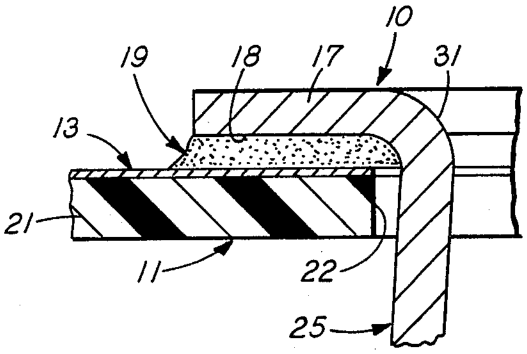
FIG. 4 is an enlarged view, similar to a portion of FIGS. 2–3, with vertical dimensions exaggerated for clarity, illustrating the assembly of the fastener with the printed circuit.

Referring to FIGS. 2 and 4, the fastener 10 is initially preassembled with the first printed circuit 11 so that a first portion of the fastener, preferably a flat head 17, is electrically and mechanically fixed to the circuit 11, as by soldering, with the under surface 18 of the head engaging and making electrical contact with the pad 13 of the circuit 11, such as by a conventional conductive solder coating 19. In one example, the circuit 11 comprises a "flexible printed circuit" of the type commonly used in Trimline® telephone handsets and having "printed" conductors including the pad 13 deposited on an outer surface of a flexible plastic substrate 21. The substrate 21 is formed with a through hole 22 in the pad area, where the fastener 10 is to be located, for later connecting the pad area 13 of that circuit to circuit conductors or components located below in the mounting element 12.

When the fastener 10 is fixed to the printed circuit 11, as viewed in FIG. 2, it is positioned so that a plurality of tapered, conductive spring fingers 25, which project outwardly from the head 17 and printed circuit 11 as shown in FIGS. 1–2, extend through the hole 22 in the circuit 11 and a preset distance "L" therebeyond.

In practice, a plurality of the fasteners may be assembled with similar pad areas 13 of the circuit 11; in one example, nine such connectors are used in one version of the Trimline handset to make a series of different connections to the telephone transmitter, receiver and operating circuitry. The fasteners 10 may be mass assembled in the holes 22 during manufacture by any conventional inserting and soldering or staking equipment.

After the fasteners 10 have been preassembled with the circuit 11, they may be assembled with the mounting element 12 by pressing downward on the circuit 11 and fastener 10 (arrow A in FIGS. 2 and 3) so as to forcibly push the lower ends of the fingers 25 into a mounting hole or bore 26 of the mounting ring 16. In the specific example illustrated, there are four downwardly projecting spring fingers 25—25, each having inwardly tapering, lower ends 27 having a maximum outer diameter (D) (FIG. 2) a predetermined amount greater than the inner diameter (d) of the bore 26.

With this arrangement, the fingers 25 are initially cammed inwardly by the walls of the bore 26 (arrows B—B) as the fastener is inserted, until a maximum diameter bulge portion 28 of each finger clears the bore 26, after which the fingers 25 spring outwardly (arrows C—C in FIG. 3) so that an indented gripping midsection 29 of each finger 25 resiliently engages the inner walls of the ring 16 and locks the fasteners 10 to the ring 16 by mechanical spring force, which makes a secure electrical connection between the outer surfaces of the fingers 25 and the inner surfaces of the ring 16.

Preferably, the fastener 10 is formed from strip stock by conventional metal stamping operations, and has an enlarged flat head 17, with a circular central aperture 31 having rectangular radial slots 32 at 90° intervals, between each set of fingers 25 as shown in FIG. 1. The fingers 25 preferably comprise arcuate pieces (as viewed from the top in FIG. 1), having upper sections 33 tapering uniformly outward at an angle $\theta$ (FIG. 2) from a top juncture with the inner periphery of the head 17, to an upper bulge portion 34, defining the upper boundary of the recessed gripping section 29. The gripping section 29 is a generally vertical section with a circular outer periphery, extending between the upper and lower bulge sections 34 and 28 and shaped to fit into the mounting element, such as the ring 16, to mechanically fasten the parts together, as previously described, with a desired spring force, such as one to two pounds (approximately 460–920 grams) force applied perpendicularly to the flexible printed circuit board 12.

In the specific example illustrated, on assembly of all parts as shown in FIG. 3, the printed circuit 11 is received on the upper surface of a first insulating support member 36, such as a telephone handset chassis assembly, which in turn is nested on a second insulating support member 37 in fixed relationship, such as a telephone dial plate assembly. The lower support 37 carries the lower printed circuit 12, as indicated in FIG. 3.

As is evident from FIG. 3, the assembly of the supports 36 and 37 in a mounting fixture (not shown in detail but designated generally by the numeral 38) provides a desired fixed relationship between the fasteners 10 attached to the upper printed circuit board 11 and the interconnecting rings 16 carried by the lower board 12; so that a force (arrows A or E) applied perpendicular to the lower printed circuit board 12 forces the fasteners 10 into or out of engagement with the retaining rings 16.

With this arrangement of simple spring fasteners 10 preassembled with the printed circuit 11, as shown in FIG. 2, in the printed circuit department of the factory, it should be apparent that the fastener/circuit assembly 10/11 may easily be assembled with the mounting element 12 at a plurality of connection points by simply placing the circuit 11 over the mounting element 12 and physically pushing down on the fasteners 10 to make a snap-fit connection. No tools are required for the assembly, and the problem of stocking and keeping track of loose screws has been eliminated.

Also, when as often happens, the printed circuit 11 is to be removed for repair or replacement of components in the assembly 11/12, the circuit 11 may easily be disassembled, without special tools and keeping track of a lot of loose screws, by simply lifting up on one end of the printed circuit 11, as indicated by arrow E in FIG. 3. This construction thus results in maintenance savings in the field, and also provides for longer life of the printed circuits 11, as the torque exerted by conventional metal screws previously used in such assemblies tends to twist the flexible circuit conductors.

A major advantage of this type of fastener 10, prefixed to the circuit 11, is that the circuit 11 can easily be pulled back from the "same side"; that is, the same side from which assembled, the top side in FIG. 3. This is advantageous in such construction as, after assembly, the under side of the assembly, below the circuit 11, is not accessible.

While one specific embodiment of the invention has been described in detail above, it will be obvious that various modifications may be made from the specific details described, without departing from the spirit and scope of the invention.

What is claimed is:

1. A fastener and printed circuit assembly capable of being assembled with a conductive mounting element having a bore, for providing an electrical connection between a conductive pattern of the circuit and the mounting element, the assembly comprising:

a snap fastener of conductive material having a first portion mechanically and electrically connected to the conductive portion of the circuit, the fastener having a plurality of tapered, conductive spring fingers projecting outwardly from the printed circuit and adapted to be inserted into the bore of the mounting element so that, when inserted, the fingers are initially cammed inwardly by the walls of the bore, following which the fingers spring outwardly to mechanically connect the fastener to the conductive element and to make electrical contact therewith; the first portion of the fastener comprising a flat head portion fixed to a conductive pad on one surface of the printed circuit, the circuit having a through hole at the pad area through which the fingers extend, the fingers being joined to the head portion and projecting therefrom.

2. An assembly as recited in claim 1, wherein each finger has a first portion joined to the head portion and tapering outwardly from the point of junction with the head portion, an indented midsection for resiliently engaging the inner walls of the bore in the mounting element, and an inwardly tapered end section that is adapted to be cammed inwardly when the end sections of the fingers are inserted into the bore.

3. An assembly as recited in any of the claims 1 or 2, wherein the fingers are contoured so that the fastener may readily be removed from the mounting element by lifting up on the printed circuit to disassemble the fastener-printed circuit assembly from the mounting element.

4. An assembly as recited in claim 3, wherein the fingers have arcuately curved outer peripheries.

5. An assembly as recited in claim 4, wherein the mounting element comprises a conductive ring mounted in a through hole of a second printed circuit, to which the first printed circuit is adapted to be electrically connected by the snap fastener.

6. An assembly comprising:

(a) a printed circuit board having a through hole and a conductive pad on an outer surface thereof surrounding the through hole;

(b) a mounting element having a conductive ring;

(c) means for mounting the circuit board over the mounting element in spaced relationship thereto so that the through hole of the board aligns vertically with the ring of the mounting element; and (d) a snap fastener of conductive material fixed to the pad of the circuit board and having spring fingers resiliently engaging the walls of the bore in the mounting ring so as to electrically connect the pad to the ring, wherein the fastener comprises a flat head portion fixed to the pad, and wherein each spring finger comprises a first portion joined to the head portion and tapering outwardly from the head portion, a recessed midsection for resiliently engaging the walls of the bore, and an inwardly tapered end section that is inserted into the ring and is cammed inwardly thereby on assembly of the fingers with the ring.

7. A method of assembling a printed circuit board with a conductive mounting ring so that a conductive pad deposited on an outer surface of the board makes electrical connection with a bore of the mounting ring, comprising:

fixing a snap fastener of conductive metal to the board so that a flat head of the fastener is mechanically and electrically connected to the pad and so that a plurality is tapered, conductive spring fingers of the fastener project downwardly from the board through a hole formed in the board in the pad area; and inserting the fingers into the bore of the mounting ring so that the fingers are initially cammed inwardly by the walls of the bore, following which the fingers spring radially outwardly so that indented gripping sections of the fingers resiliently grip the walls of the bore to mechanically connect the fastener to the ring and to make electrical contact therewith.

* * * * *